(12) United States Patent
Cheng et al.

(10) Patent No.: US 10,789,444 B2
(45) Date of Patent: Sep. 29, 2020

(54) DISPLAY APPARATUS

(71) Applicant: Innolux Corporation, Miao-Li County (TW)

(72) Inventors: Chang-Chiang Cheng, Miao-Li County (TW); Chih-Hao Chang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/049,925

(22) Filed: Jul. 31, 2018

(65) Prior Publication Data

US 2019/0065806 A1 Feb. 28, 2019

(30) Foreign Application Priority Data

Aug. 25, 2017 (CN) .......................... 2017 1 0742653

(51) Int. Cl.
*G06K 9/00* (2006.01)
*B06B 1/06* (2006.01)
(Continued)

(52) U.S. Cl.
CPC .......... *G06K 9/0002* (2013.01); *B06B 1/0207* (2013.01); *B06B 1/0696* (2013.01); *G02F 1/13338* (2013.01); *G02F 1/133514* (2013.01); *G02F 1/133528* (2013.01); *G02F 1/134309* (2013.01); *H01L 25/0753* (2013.01); *H01L 27/322* (2013.01); *H01L 27/3234* (2013.01); *H01L 27/3244* (2013.01); *H01L 33/58* (2013.01); *H01L 51/5284* (2013.01);
(Continued)

(58) Field of Classification Search
CPC .. G06K 9/0002; B06B 1/0696; B06B 1/0207; B06B 2201/70; H01L 27/322; H01L 27/3234; H01L 27/3244; H01L 51/5284; H01L 25/0753; H01L 33/58; H01L 27/3225; H01L 51/5281; H01L 25/167; H01L 33/62; G02F 1/13338; G02F 1/133528; G02F 1/133514; G02F 1/134309; G02F 2001/133394
See application file for complete search history.

(56) References Cited

U.S. PATENT DOCUMENTS 9,323,393 B2 * 4/2016 Djordjev .............. G06K 9/0002
10,211,266 B2 * 2/2019 Wang ..................... G06F 3/041
(Continued)

*Primary Examiner* — Hoan C Nguyen
(74) *Attorney, Agent, or Firm* — McClure, Qualey & Rodack, LLP

(57) ABSTRACT

A display apparatus includes a first substrate; a pixel array layer disposed on the first substrate and defining a display area and a non-display area, and the pixel array layer including a pixel signal line; a second substrate disposed opposite to the first substrate; a display medium disposed between the first substrate and the second substrate; and an ultrasonic element (UE) layer, disposed on the second substrate and including an ultrasonic signal line. Within at least parts of the display area corresponding to the ultrasonic element layer, a projection area on the first substrate by projecting the ultrasonic signal line along the normal direction of the first substrate at least partially overlaps with another projection area on the first substrate by projecting the pixel signal line along the normal direction of the first substrate.

18 Claims, 16 Drawing Sheets

(51) Int. Cl.
*H01L 27/32* (2006.01)
*H01L 51/52* (2006.01)
*H01L 25/075* (2006.01)
*H01L 33/58* (2010.01)
*G02F 1/1333* (2006.01)
*G02F 1/1335* (2006.01)
*G02F 1/1343* (2006.01)
*B06B 1/02* (2006.01)
*H01L 33/62* (2010.01)
*H01L 25/16* (2006.01)

(52) U.S. Cl.
CPC ............ *B06B 2201/70* (2013.01); *G02F 2001/133394* (2013.01); *H01L 25/167* (2013.01); *H01L 27/3225* (2013.01); *H01L 33/62* (2013.01); *H01L 51/5281* (2013.01)

(56) References Cited

U.S. PATENT DOCUMENTS

| | | | |
|---|---|---|---|
| 2015/0169136 A1* | 6/2015 | Ganti | B06B 1/0666 345/177 |
| 2015/0309644 A1* | 10/2015 | Sun | G06F 3/0416 345/173 |
| 2015/0346860 A1* | 12/2015 | Qin | G06F 3/0412 345/174 |
| 2016/0019854 A1* | 1/2016 | Liu | G06F 3/044 345/204 |
| 2016/0364072 A1* | 12/2016 | Chiang | G02F 1/134309 |

* cited by examiner

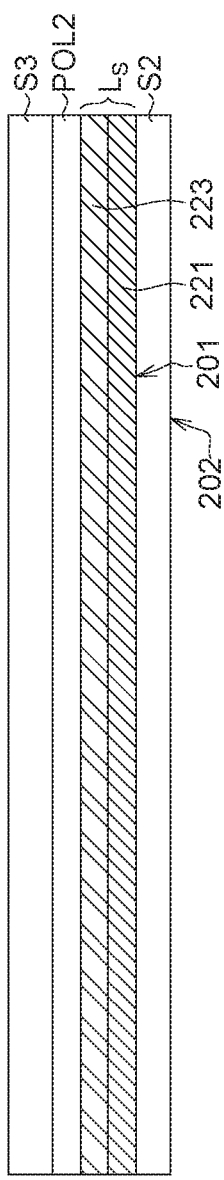
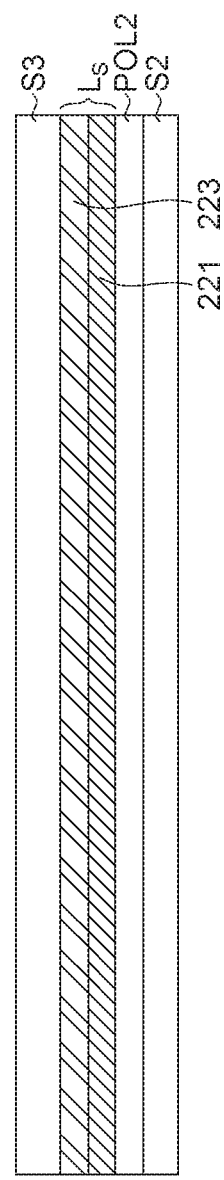
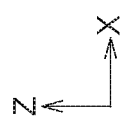
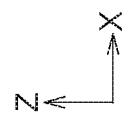
FIG. 7A
FIG. 7B

DISPLAY APPARATUS

This application claims the benefit of People's Republic of China application Serial No. 201710742653.0, filed Aug. 25, 2017, the subject matters of which are incorporated herein by references.

BACKGROUND

Technical Field

The disclosure relates in general to a electronic apparatus, and more particularly to a display apparatus capable of identifying surface characteristics or features.

Description of the Related Art

Electronic products with display panel, such as smart phones, tablets, notebooks, monitors, and TVs, have become indispensable necessities to modern people no matter in their work, study or entertainment, especially portable electronic products. With a flourishing development of the electronic products, the consumers not only pursue better electronic characteristics such as higher display quality, higher speed of response, longer life span and higher reliability, but also have higher expects on the functions of the products to be more diversified. For example, the identification function (such as fingerprint identification or iris recognition) can be further included to make the display apparatus more personalized and provide a more secure way of login.

In the known techniques, capacitive, thermal, or optical fingerprint sensing circuits are fabricated on silicon wafers for making the fingerprint sensors. Taking a capacitive sensing circuits fabricated on silicon wafers as an example, it requires high accuracy of the design and also a protective layer to protect the surface of the sensor to ensure the accuracy of identification; however, this fabrication is costly and difficult to integrate the sensor in an electronic mobile apparatus such as cellular phones. Also, it requires extra space to install a fingerprint identification device in a mobile apparatus, such as installed behind a main screen button (i.e. home button) of the mobile apparatus. However, many commercially available mobile apparatus have been designed to maximize the appearance and the display screen. The physical home button is no longer set on the front of the mobile apparatus. In some of mobile apparatus, an additional hole in the back casing is required for placing the fingerprint identification device in the rear of the mobile apparatus, which increases the production cost of the apparatus. In some of mobile apparatus, a fingerprint identification region is moved to lateral side of the body of the apparatus. Since most consumers use right hand, the fingerprint identification region is designed on the right lateral side of the apparatus to meet the majority of the consumers' needs. Therefore, to integrate the current silicon wafer fingerprint sensing technology into a current transparent touch display screens, hardware compatibility is one of considerable problems.

SUMMARY

The disclosure is directed to a display apparatus, wherein an ultrasonic element (UE) layer is fabricated in an upper assembled component (such as formed on an upper glass substrate) of the display apparatus for achieving the function of features/characteristics identification, and the UE layer is positioned within a display area.

According to one embodiment of the present disclosure, a display apparatus is provided, including a first substrate; a pixel array layer, disposed on the first substrate and defining a display area and a non-display area, and the pixel array layer including a pixel signal line; a second substrate, disposed opposite to the first substrate; a display medium layer, disposed between the first substrate and the second substrate; and an ultrasonic element (UE) layer, disposed on the second substrate and including an ultrasonic signal line. Within at least parts of the display area corresponding to the ultrasonic element layer, a projection area on the first substrate by projecting the ultrasonic signal line along a normal direction of the first substrate at least partially overlaps with another projection area on the first substrate by projecting the pixel signal line along the normal direction of the first substrate.

The disclosure will become apparent from the following detailed description of the preferred but non-limiting embodiments. The following description is made with reference to the accompanying drawings.

BRIEF DESCRIPTION OF THE DRAWINGS

FIG. 7A and FIG. 7B are simple drawings of other two types of the second assembled component according to the first embodiment of the present disclosure.

DETAILED DESCRIPTION

Figure 1:
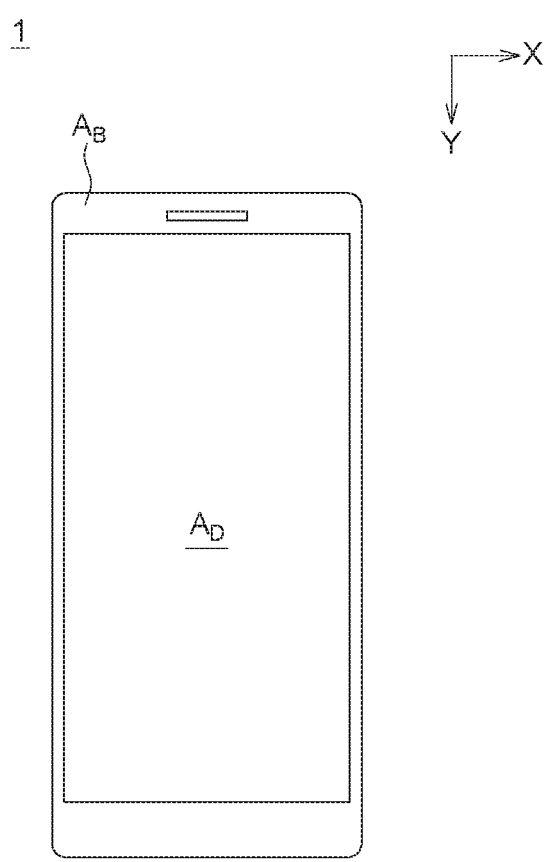
FIG. 1 is a simple drawing of a display apparatus according to an embodiment of the disclosure.

In the embodiments of the present disclosure, a display apparatus, especially a display apparatus capable of identifying surface features/characteristics, is provided. According to the embodiments, an ultrasonic element (UE) layer can be fabricated in an upper assembled component (such as formed on an upper glass substrate) of a display apparatus (such as a touchscreen display apparatus), wherein the ultrasonic element (UE) layer is positioned within a display area, and the related elements of the UE layer are formed by using an array process for achieving the function of features/characteristics identification. The embodiments of the disclosure can be widely used in various applications. A to-be-identified object could be the biological surface features such as fingerprints (e.g. fingerprint identification), or other biological features such as lines or patterns. Alternatively, a to-be-identified object could be any pattern on a surface of a non-biological object that has different reflective states for ultrasound. Thus, to-be-identified objects identified by the embodiments in the applications is not limited to biological or non-biological objects, as long as the reflection differences on the ultrasonic wave caused by the to-be-identified features/characteristics can be obtained (e.g. a pattern with height differences has different reflection states for ultrasound).

The several embodiments are described in details with reference to the accompanying drawings. It is noted that the details of the structures and procedures of the embodiments are provided for exemplification, and the described details of the embodiments are not intended to limit the present disclosure. Also, the identical and/or similar elements of the embodiments are designated with the same and/or similar reference numerals. It is noted that not all embodiments of the disclosure are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense.

Moreover, when a first material layer being formed/disposed at, on or above a second material layer have been described in the embodiments, it includes the condition of the first material layer contacting the second material layer. It also includes conditions of one or more material layers disposed between the first material layer and the second material layer, wherein the first material layer may not be directly contact the second material layer. Additionally, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 2:
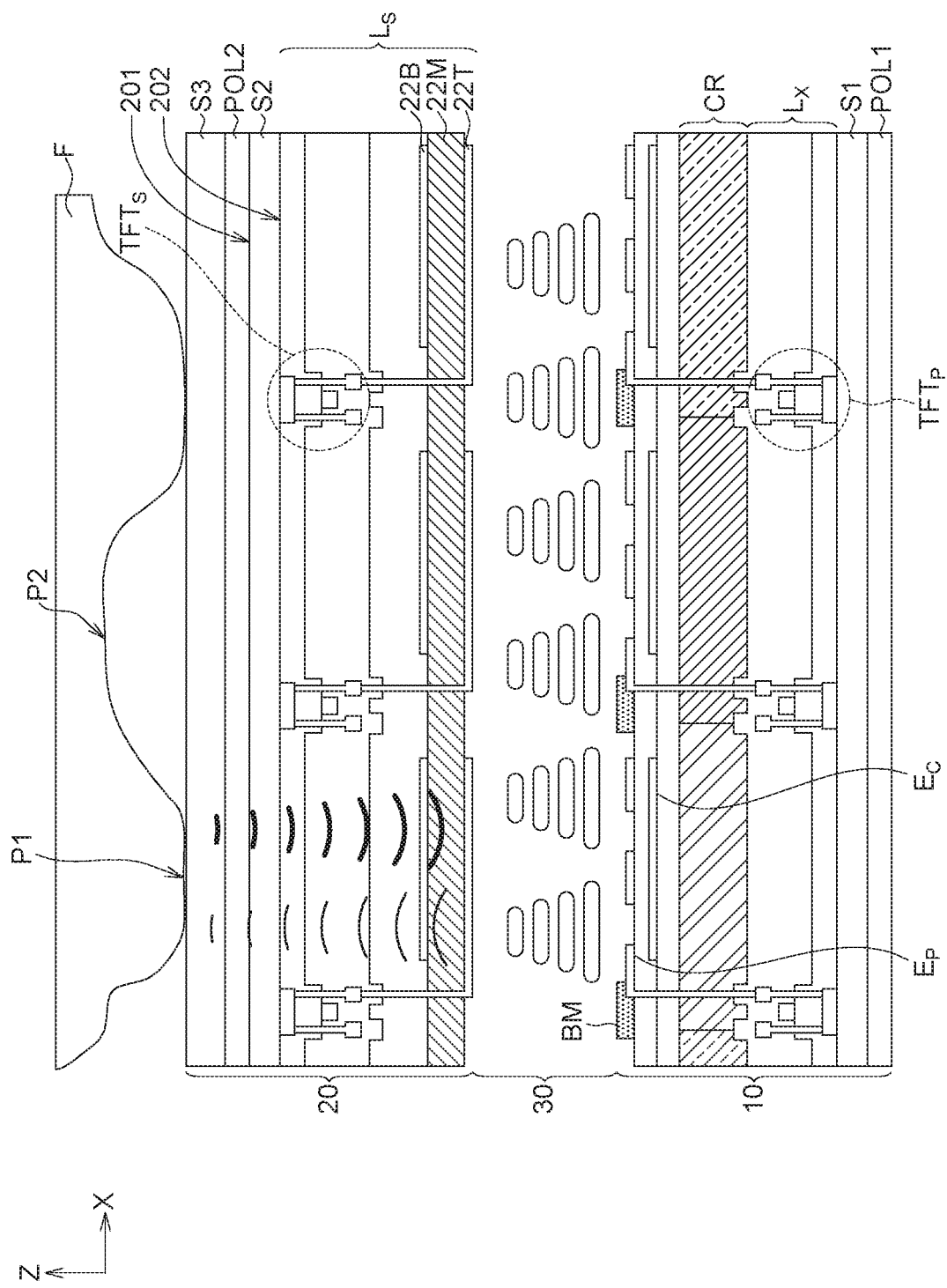
FIG. 2 is a cross-sectional view of a display apparatus according to the first embodiment of the disclosure.

FIG. 1 is a simple drawing of a display apparatus according to an embodiment of the disclosure. A display apparatus 1 includes a display area $A_D$ and a non-display area $A_B$. FIG. 2 is a cross-sectional view of a display apparatus according to the first embodiment of the disclosure. In the embodiment, a display apparatus includes a first assembled component 10, a second assembled component 20 assembled to the first assembled component 10, and a display medium layer 30 disposed between the first assembled component 10 and the second assembled component 20. In the first embodiment, a liquid crystal display apparatus is exemplified for illustrating a display apparatus in the application, wherein the display medium layer 30 is a liquid crystal (LC) layer.

In the embodiment, the first assembled component 10 includes a first substrate S1 and a pixel array layer $L_X$ disposed on the first substrate S1, wherein the display area $A_D$ and the non-display area $A_B$ of the display apparatus can be defined by the design of the pixel array layer $L_X$. That is, the display area $A_D$ is an area of image display and is also an area of pixel arrangement (e.g. R, G and B pixels). The non-display area $A_B$ is an area outside the display area $A_D$. The second assembled component 20 includes a second substrate S2 and an ultrasonic element (UE) layer $L_S$ (including such as piezoelectric material and an array of identification circuit). The first substrate S1 and the second substrate S2 can be glass substrates, but the present disclosure is not limited thereto. Substrates made from other transparent materials, such as polyimide (PI), polyethylene terephthalate (PET), etc., are applicable. Also, flexible or non-flexible substrates can be selected as the substrate of the embodiment.

In the embodiment, identification of surface characteristics can be achieved by fabricating the related elements (including such as piezoelectric material and an array of identification circuit) of ultrasonic identification in the second assembled component 20, such as formed on the second substrate S2 (e.g. an upper glass substrate), and fabricated by using an array process. Because the ultrasonic element (UE) layer $L_S$ of the embodiment is formed within the display area, the signal lines of array of ultrasonic identification circuit of the embodiment (such as data lines, scan lines, common electrodes or bias lines; any circuit trace related to the operation is applicable, and the disclosure has no particularly limitation thereto) at least partially overlaps or fully overlaps with the signal lines of the pixel array layer of the embodiment (such as data lines, scan lines, common electrodes or bias lines; any circuit trace related to the operation is applicable, and the disclosure has no particularly limitation thereto), or the signal lines of array of ultrasonic identification circuit of the embodiment are disposed away from the pixel opening area, thereby reducing or preventing the loss of aperture ratio of the display pixel array.

Figure 3:
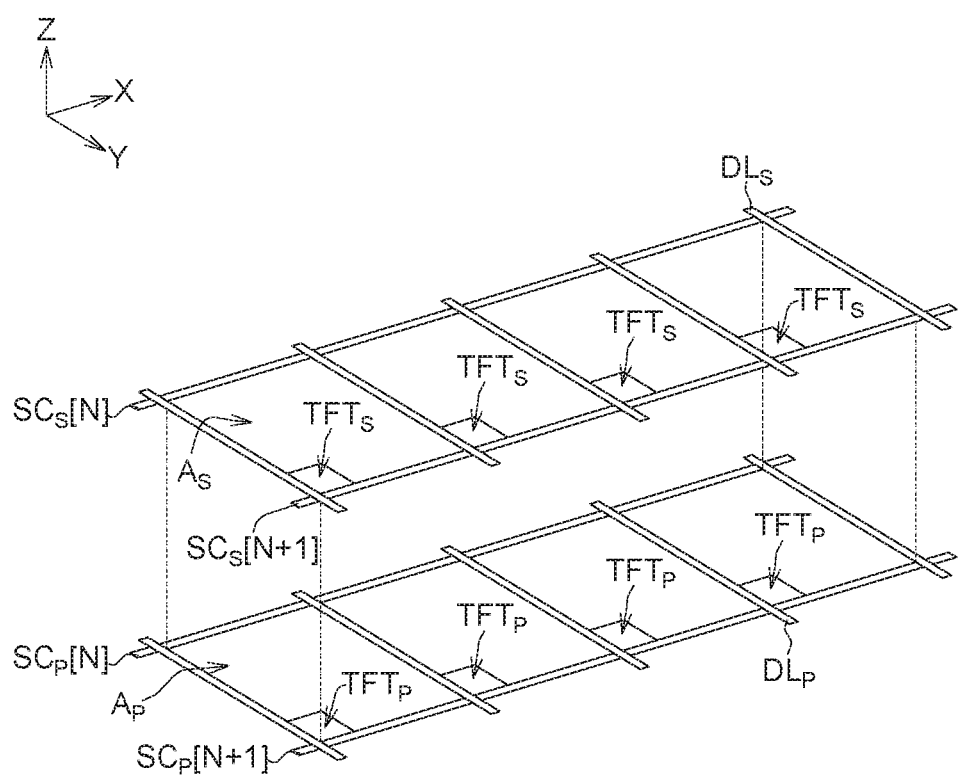
FIG. 3 depicts the signal lines of array of ultrasonic identification circuit and the signal lines of the pixel array according to one embodiment of the disclosure.

FIG. 3 depicts the signal lines of array of ultrasonic identification circuit and the signal lines of the pixel array according to one embodiment of the disclosure. In the pixel array layer $L_X$ (as shown in FIG. 2) disposed on the first substrate S1 of one embodiment, examples of the signal lines include a plurality of pixel signal lines $DL_P$ and a plurality of pixel scan lines $SC_P$ intersected with each other, resulting in several pixel regions $A_P$ arranged as an array within a display area $A_D$, wherein each of the pixel region $A_P$ is controlled by at least one pixel transistor TFT disposed corresponding to the intersection of each of the pixel signal lines $DL_P$ and each of the pixel scan lines $SC_P$. Also, in an ultrasonic element (UE) layer $L_S$ (as shown in FIG. 2) disposed on the second substrate S2 of one embodiment, examples of the signal lines include a plurality of ultrasonic signal lines $DL_S$ and a plurality of ultrasonic scan lines $SC_S$ intersected with each other, resulting in several sensing regions $A_S$ arranged as an array within the display area $A_D$, wherein each of the sensing regions $A_S$ is controlled by at least one UE transistor TFTs disposed correspondingly to the intersection of each of the ultrasonic signal lines $DL_S$ and each of the ultrasonic scan lines $SC_S$. Data is read from the ultrasonic signal lines $DL_S$.

According to one embodiment of the present disclosure, within at least parts of the display area corresponding to the ultrasonic element layer, a projection area on the first substrate S1 by projecting the ultrasonic signal line along a normal direction of the first substrate S1 at least partially overlaps with another projection area on the first substrate S1 by projecting the pixel signal line along the normal direction of the first substrate S1. For example, the projection area on the first substrate S1 by projecting the ultrasonic signal line $DL_S$ along a normal direction (such as Z-direction in FIG. 2) of the first substrate S1 at least partially overlaps with another projection area on the first substrate S1 by projecting the pixel signal line $DL_P$ along the normal direction (such as Z-direction in FIG. 2) of the first substrate S1. In other words, a top view of the second substrate S2 (for example, the second assembled component 20/the second substrate S2 is viewed from the XY plane in FIG. 3) shows that the positions of the ultrasonic signal lines $DL_S$ correspond to the positions of the pixel signal lines $DL_P$, so that the signal lines of the pixel array layer $L_X$ are able to partially overlap or fully overlap with the signal lines of the ultrasonic element (UE) layer $L_S$, or the pixel regions $A_P$ would be partially overlapped or not overlapped by the signal lines, for example the ultrasonic signal lines $DL_S$ of the ultrasonic element layer $L_S$. Also, in another embodiment, a top view of the second substrate S2 (for example, the second assembled component 20/the second substrate S2 is viewed from the XY plane in FIG. 3) shows that a position of a UE transistor TFTs in each of the sensing regions $A_S$ is corresponding to a position of a pixel transistor TFT in each of the pixel regions $A_P$. In practical applications, the widths of the signal lines of the ultrasonic element (UE) layer and the pixel array layer can be the same or slightly different. Whether the widths of the signal lines, when the display apparatus is viewed in the normal direction (e.g. Z direction) of the second substrate S2, the signal lines of the ultrasonic element (UE) layer and the pixel array layer can be partially or fully overlapped each other.

Figure 4A:
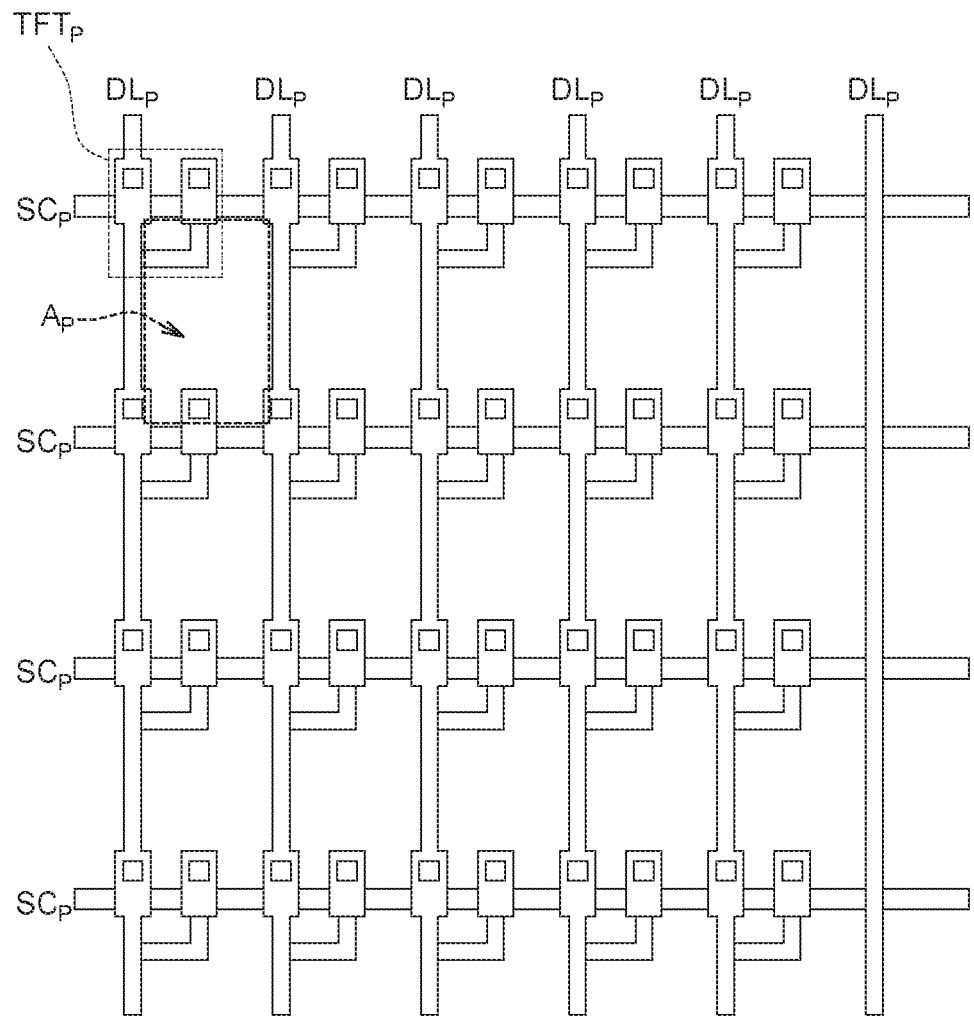
FIG. 4A and FIG. 4B are top views f signal lines of a pixel array and signal lines of an array of ultrasonic identification circuit according to one embodiment of the disclosure, respectively.
Figure 4B:
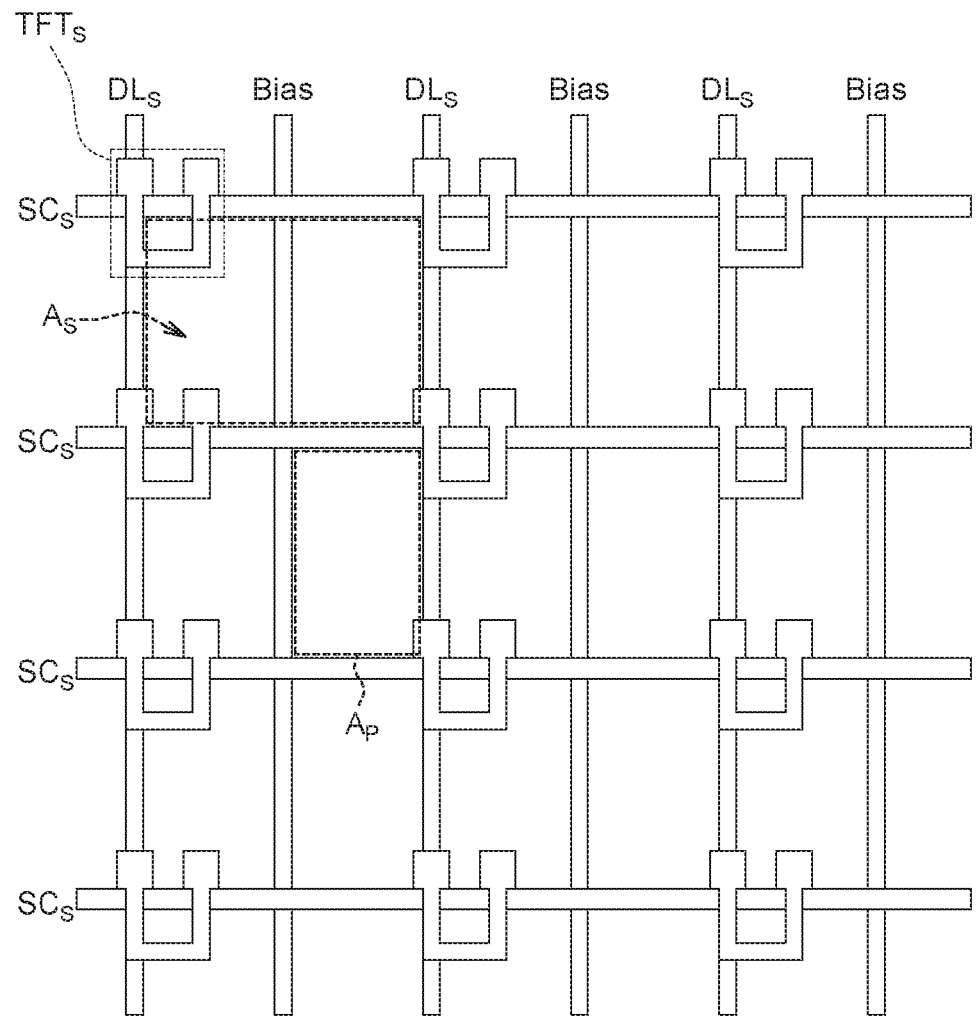
Figure 4C:
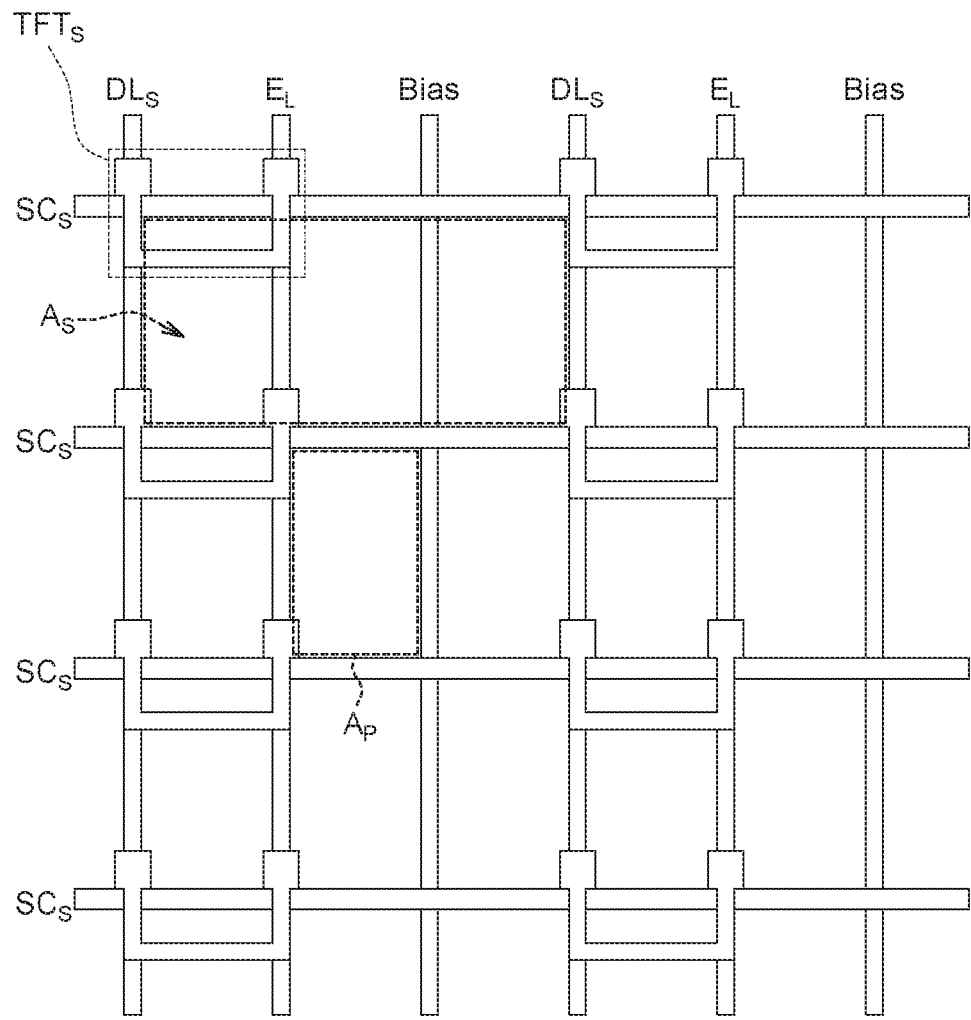
FIG. 4C is a top view of signal lines of another array of ultrasonic identification circuit according to another embodiment of the disclosure.

FIG. 4A and FIG. 4B are top views of signal lines of a pixel array and signal lines of an array of ultrasonic identification circuit according to one embodiment of the disclosure, respectively. The signal lines of a pixel array and the signal lines of an array of ultrasonic identification circuit can be formed on the lower and upper substrates (i.e. the first substrate S1 and the second substrate S2). The ultrasonic signal lines $DL_S$, the ultrasonic bias lines and the ultrasonic scan lines $SC_S$ positioned above are disposed correspondingly to the pixel signal lines $DL_P$ and the pixel scan lines $SC_P$ positioned beneath, respectively. Also, in this example, the positions/sizes (including widths of signal lines)/shapes/areas/regions of the sensing regions $A_S$ are substantially two times of the positions/sizes (including widths of signal lines)/shapes/areas/regions of the pixel regions $A_P$. Additionally, in this example, the positions/sizes/shapes/areas/regions of the UE transistors TFTs of the sensing regions $A_S$ are substantially identical to the positions/sizes/shapes/areas/regions of the pixel transistors TFT of the pixel regions $A_P$. Moreover, the disclosure is not limited to the configurations of the signal lines of an array of ultrasonic identification circuit as shown in FIG. 4B, and the ultrasonic signal lines can be arranged based on the requirements of practical applications. For example, FIG. 4C is a top view of signal lines of another array of ultrasonic identification circuit according to another embodiment of the disclosure. In FIG. 4B, the source and drain (S/D) of each of the read transistors (i.e. the UE transistors TFTs) do not span over the pixel region $A_P$ (noted that the sensing regions $A_S$ and the pixel regions $A_P$ are disposed in different layers, so that the pixel region $A_P$ labelled in FIG. 4B is a projection of the pixel region $A_P$ on the ultrasonic element (UE) layer; also, only one of sensing regions $A_S$ and one of pixel regions $A_P$ as projected are labelled in FIG. 4B for simple demonstration). However, the source and drain (S/D) of each of the read transistors (i.e. the UE transistors TFTs) in FIG. 4C span over the pixel region $A_P$ (noted that the sensing region $A_S$ and the pixel region $A_P$ are disposed in different layers, the pixel region $A_P$ labelled in FIG. 4C is a projection of the pixel region $A_P$ on the ultrasonic element (UE) layer. Similarly, only one of sensing regions $A_S$ and one of pixel regions $A_P$ as projected are labelled in FIG. 4C for simple demonstration). It is noted that the detailed configurations of each of the signal lines and transistors are depicted only for exemplifications. It is known by people skill in the art that the configurations of related elements can be adjusted and modified according to the requirements of the practical applications, as long as the array of ultrasonic identification circuit positioned above has no effect on the aperture ratio of the pixel array positioned beneath.

According to the descriptions above, the signal lines of a pixel array and the signal lines of an array of ultrasonic identification circuit of the embodiment disposed separately in different layers are overlapped each other along the direction vertical to the first substrate, thereby reducing the loss of aperture ratio (as shown in FIG. 3-FIG. 4B). Moreover, the design of the embodiment also decreases the coupling interference between the signal lines of the pixel array and the signal lines of the array of ultrasonic identification circuit, or solves the problem of excessive resistive and capacitive (RC) loading.

Additionally, in one embodiment, the ultrasonic element (UE) layer $L_S$ of the embodiment includes an upper electrode 22T, a lower electrode 22B, and a piezoelectric material layer 22M disposed between the upper electrode 22T and the lower electrode 22B, as shown in FIG. 2. When an appropriate voltage is applied to the upper electrode 22T and the lower electrode 22B, the piezoelectric material layer 22M undergoes contraction and expansion, and this deformation characteristics cause mechanical vibration at the ultrasonic frequency. When a transmitter emits ultrasonic waves toward an object to be identified (/object to be detected), ultrasonic waves reflected from the object can be detected, and the characteristics/features of the object to be identified Object to be detected) can be obtained according to different reflection states obtained by a receiver. As shown in FIG. 2, it is assumed that an object to be identified (/object to be detected) is fingerprints of a finger F. That is, the embodiment of the disclosure is applied to a display apparatus having function of fingerprint identification. When the piezoelectric material layer 22M emits ultrasonic waves to penetrate the medium toward the finger F, the ultrasound will be partially reflected when the ultrasonic wave reaches the ridge (e.g. the position P1). The energy of the ultrasonic wave reflected at the valley (e.g. the position P2) is less than the energy reflected at the ridge. The ultrasonic wave reflected from the object to be identified (/object to be detected) as detected can be processed through appropriate circuit processing, a fingerprint image can be obtained. Additionally, in practical applications, different piezoelectric material layers can be adopted for emitting and receiving the ultrasonic waves separately. Alternatively, emitting and receiving the ultrasonic waves can be performed by the same piezoelectric material layer (for example, ultrasonic transmission and ultrasonic reception are performed in accordance with the time series and time-sharing manner). The disclosure has no particular limitation thereto. In one example, when the same piezoelectric material layer is adopted for performing ultrasonic transmission and reception, the duration times (/time intervals) of start and stop emitting ultrasound (of stop and start receiving ultrasound) is shorter than the timing exchange for performing ultrasonic transmission and reception by different piezoelectric material layers.

Figure 5:
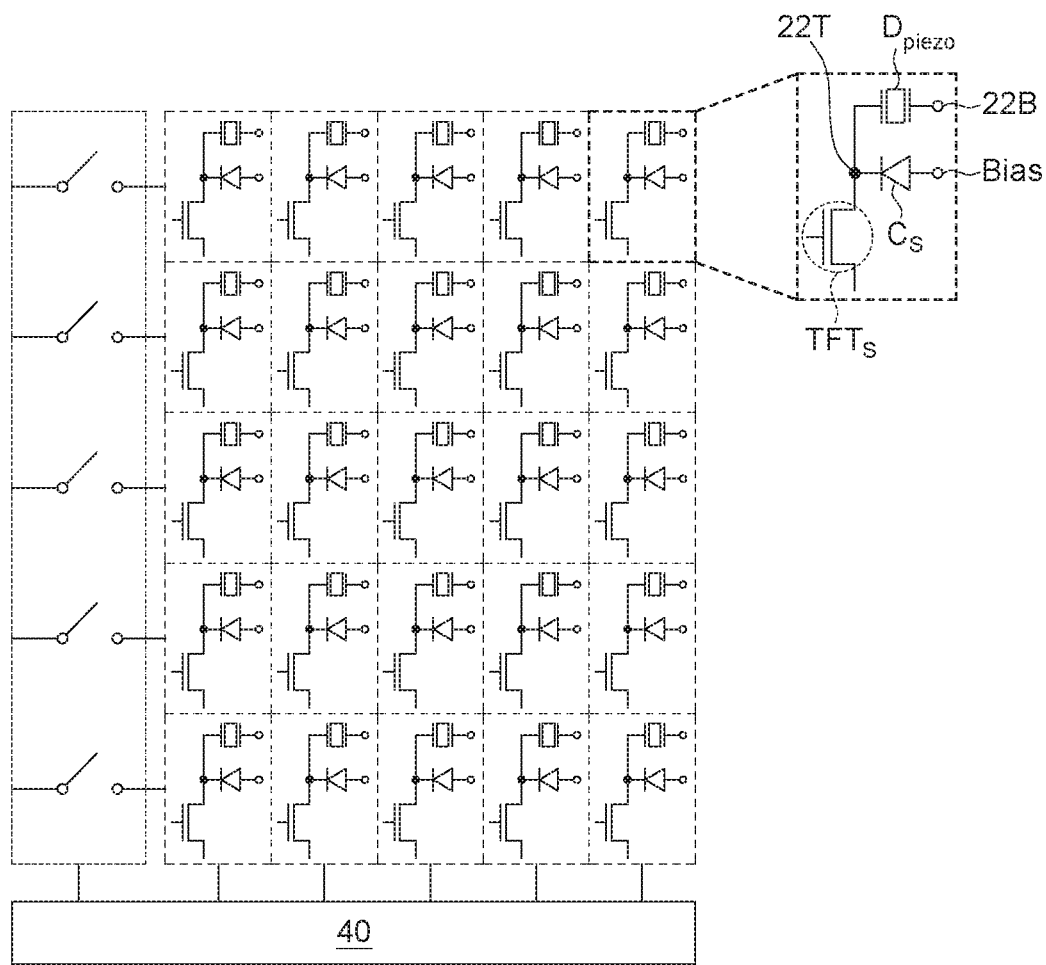
FIG. 5 is a simple drawing of an array (5×5) of ultrasonic identification circuit according to one embodiment of the disclosure.
Figure 6A:
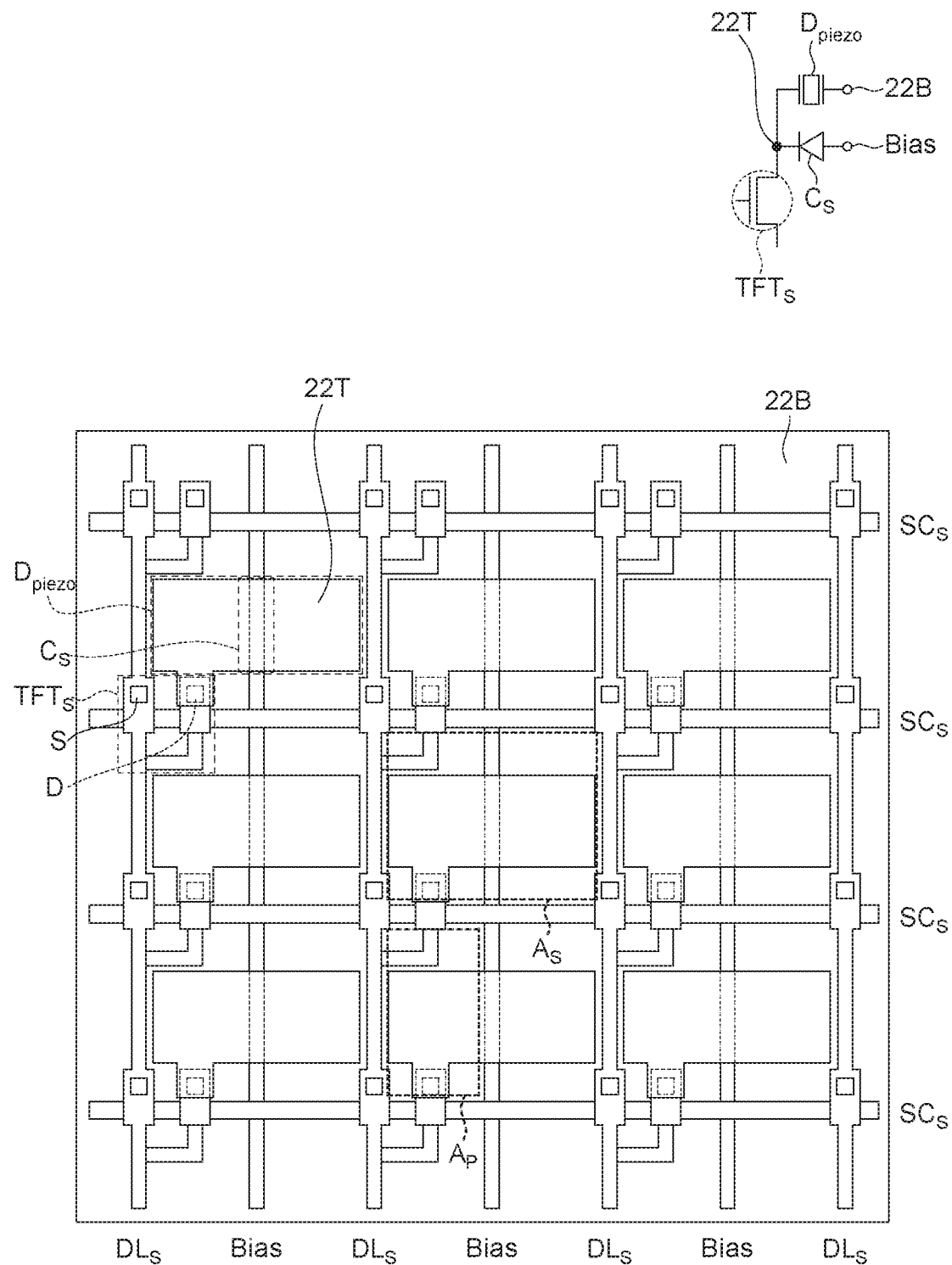
FIG. 6A is a top view of one type of signal lines of an array of ultrasonic identification circuit according to one embodiment of the disclosure.
Figure 6B:
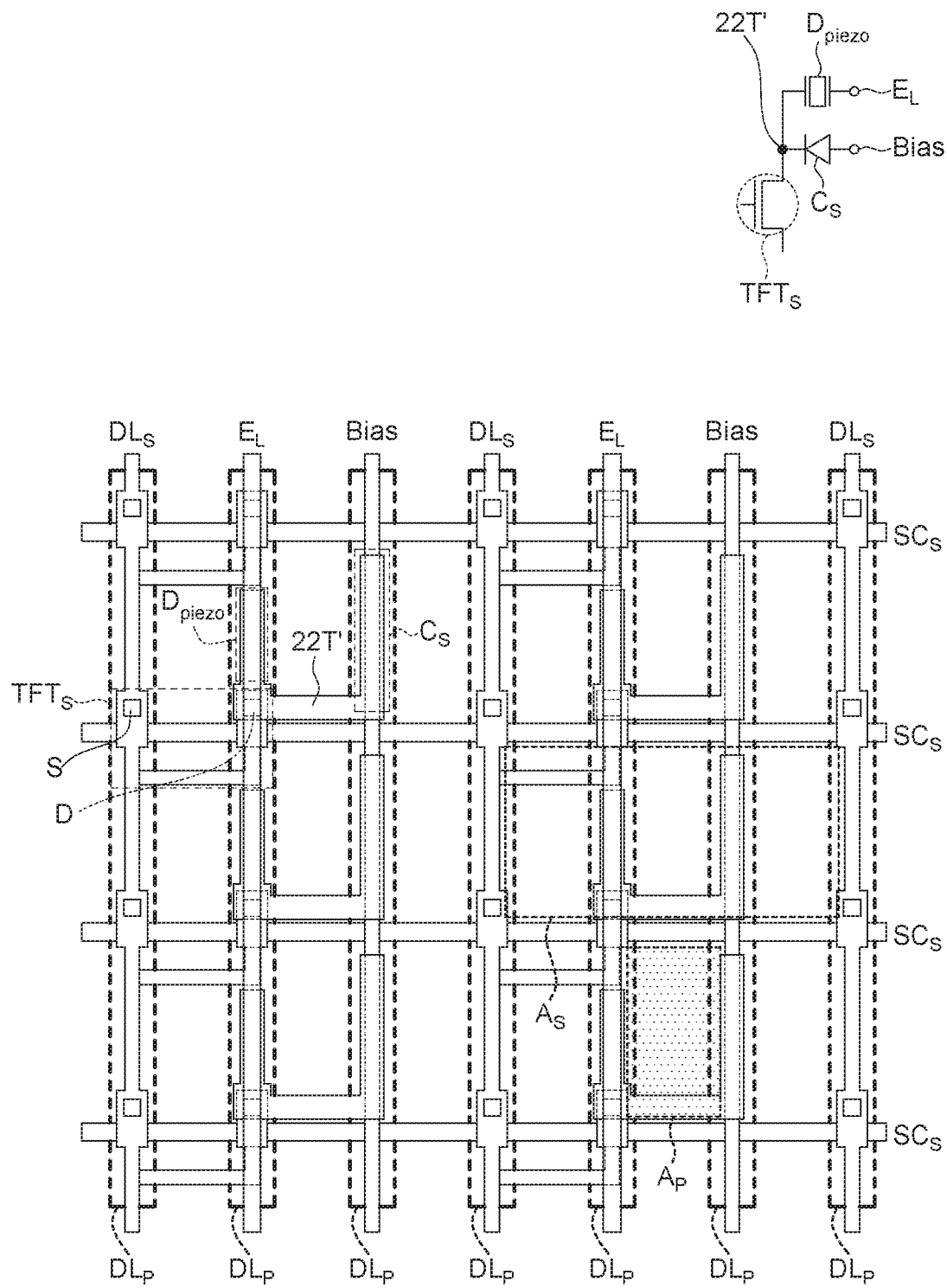
FIG. 6B is a top view of another type of signal lines of an array of ultrasonic identification circuit according to one embodiment of the disclosure.

The applicable circuit types of the disclosure are variable and not particularly limited herein. FIG. 5 is a simple drawing of an array (5×5) of ultrasonic identification circuit according to one embodiment of the disclosure. FIG. 6A is a top view of one type of signal lines of an array of ultrasonic identification circuit according to one embodiment of the disclosure, and FIG. 6B is a top view of another type of signal lines of an array of ultrasonic identification circuit according to one embodiment of the disclosure, which are provided for illustrating the ultrasonic identification, wherein FIG. 6B is related to FIG. 4C. Please refer to (but not limited to) FIG. 5, FIG. 6A and FIG. 6B. In each of the sensing regions $A_S$ (regarded as a pixel herein), the first end of a piezoelectric sensing device $D_{piezo}$ (i.e. including the upper electrode 22T, the piezoelectric material layer 22M and the lower electrode 22B, as shown in FIG. 2) is a bias receiving electrode (such as the lower electrode 22B), the first end of a diode is applied with a bias voltage labelled as Bias, and the second end of the piezoelectric sensing device $D_{piezo}$ is a pixel input electrode (such as the upper electrode 22T) and coupled to the second end of the diode. In one example, the pixel input electrode is extended along an extending direction of the ultrasonic signal line (such as Y-direction in FIG. 3), and the pixel input electrode may have different lengths at the bias receiving electrode $E_L$ and the bias line Bias depending on the requirements of applications. A control unit 40 is responsible for selecting the input levels, providing the timing signals, and reading the reflection signals. The piezoelectric material of each pixel can convert the received ultrasonic energy into the electrical charges. The diode (or capacitor $C_S$) can temporarily store the maximum amount of the electrical charges received by the piezoelectric material. Take the fingerprint identification as an example, higher ultrasonic reflection energy from the ridges of the fingerprint is received, so that the diode (or capacitor $C_S$) stores more electrical charges as converted. Lower ultrasonic reflection energy from the valleys of the fingerprint is received, so that the diode (or capacitor $C_S$) stores less electrical charges as converted. Next, the control unit 40 sequentially scans and turns on each column of the pixel array by using the gate driving circuit or the shift register, and each row of the read transistors TFTs are triggered, and the signals are outputted to the processed integrated circuit (IC). In the present disclosure, one or all of the upper and lower electrodes can be the electrodes with complete surfaces (i.e. without patterns) or the electrodes with patterns. Also, in the present disclosure, the piezoelectric material layer can be configured as a layer with or without pattern, depending on the requirements of practical applications. In the embodiment, a bias receiving electrode, such as the lower electrode 22B as shown in FIG. 6A, can be an electrode with complete surface continuously corresponding to all of the sensing regions $A_S$. Alternatively, a bias receiving electrode, such as the bias receiving electrode $E_L$ as shown in FIG. 6B, can be a patterned electrode. In the embodiments, the bias receiving electrode $E_L$ and the pixel input electrode (such as the upper electrode 22T, respectively corresponding to each of the sensing regions $A_S$) can be transparent ITO electrodes or opaque metal electrodes, which can be determined and selected according to the actual designs of the practical applications. In the embodiment of FIG. 6B, the signal lines of the ultrasonic element layer include ultrasonic scan lines $SC_S$, ultrasonic signal lines $DL_S$, and bias receiving electrodes $E_L$. The bias receiving electrode $E_L$ at least partially overlaps with the pixel signal line $DL_P$ in the top view of the second substrate S2, and the pixel region $A_P$ is partially overlapped or not overlapped by the bias receiving electrode $E_L$.

In FIG. 6A, the source and drain S/D of each of the read transistors (i.e. the UE transistors TFTs) do not span over the pixel region $A_P$ (noted that the sensing region $A_S$ and the pixel region $A_P$ are disposed in different layers, so that the pixel region $A_P$ labelled in FIG. 6A is a projection of the pixel region $A_P$ on the ultrasonic element (UE) layer; also, only one of sensing regions $A_S$ and one of pixel regions $A_P$ as projected are labelled in FIG. 6A for simple demonstration); for example, the source and drain S/D are disposed between the ultrasonic signal line $DL_S$ and the ultrasonic bias line Bias (i.e. the drain does not reach the ultrasonic bias line Bias). However, the source and drain S/D of each of the read transistors (i.e. the UE transistors TFTs) depicted in FIG. 6B span over the pixel region $A_P$ (noted that the sensing region $A_S$ and the pixel region $A_P$ are disposed in different layers, so that the pixel region $A_P$ labelled in FIG. 6B is a projection of the pixel region $A_P$ on the ultrasonic element (UE) layer; similarly, only one of sensing regions $A_S$ and one of pixel regions $A_P$ as projected are labelled in FIG. 6B for simple demonstration); for example, the source and drain S/D are disposed correspondingly to the ultrasonic signal line $DL_S$ and the bias receiving electrode $E_L$. Also, in the present disclosure, one or all of the upper and lower electrodes can be configured as planar electrodes (e.g. having complete surfaces) or configured as patterned electrodes, depending on the design requirements of the practical applications. In one example as shown in FIG. 6A, the upper electrode 22T in each of the sensing regions $A_S$ is an electrode with complete surface corresponding to the sensing region $A_S$, while the lower electrode 22B is also an electrode with complete surface. In another example as shown in FIG. 6B, the electrode 22T is a U-shaped patterned electrode, disposed along the ultrasonic bias receiving electrode $E_L$, the ultrasonic scan line $SC_S$ and the ultrasonic bias line Bias. In FIG. 6B, the ultrasonic bias receiving electrode $E_L$ is disposed above a portion of the U-shaped electrode 22T', wherein an insulating layer is disposed between the ultrasonic bias receiving electrode $E_L$ and the U-shaped electrode 22T'. The ultrasonic bias receiving electrode $E_L$ as shown in FIG. 6B can be made of ITO or metal materials. Similarly, the U-shaped electrode 22T' can be made of ITO or metal materials.

It is noted that the configurations of the drawings (such as FIG. 4A-FIG. 6A/FIG. 6B) are provided for illustrations, including the signal lines of a pixel array disposed beneath and the signal lines of an array of ultrasonic identification circuit disposed above, wherein the circuits in every pixel region $A_P$ and every sensing region $A_S$ may include one or more TFTs, and the disclosure has no particular limitation thereto. Also, each of the TFTs may include one or more channels (e.g. two channels depicted in the drawings, but the disclosure is not limited thereto). Also, arrangement of other components and signal lines can be modified according to the practical applications, and those are not limited to the illustration herein.

Additionally, please refer back to FIG. 2, the first assembled component 10 and the second assembled component 20 includes the polarizers POL1 and POL2 for attaching at outsides of the first substrate S1 and the second substrate S2, respectively. Also, a third substrate S3 (such as a cover glass CG) covers the layers beneath as positioned at the most outside of the second assembled component 20. Also, in the first embodiment, an ultrasonic element (UE) layer $L_S$ is disposed in the second assembled component 20 by using the in-cell technology. As shown in FIG. 2, the second substrate S2 has a first surface 201 and a second surface 202 positioned oppositely, and the polarizer POL2 and the ultrasonic element (UE) layer $L_S$ are respectively disposed on the first surface 201 and the second surface 202, and the third substrate S3 is disposed on the polarizer POL2.

It is noted that the ultrasonic element (UE) layer $L_S$ not limited to be disposed on the position shown in FIG. 2. The ultrasonic element (UE) layer $L_S$ can be disposed on the first surface 201 of the second substrate S2. FIG. 7A and FIG. 7B are simple drawings of other two types of the second assembled component according to the first embodiment of the present disclosure. In FIG. 7A and FIG. 7B, the polarizer POL2 and the ultrasonic element (UE) layer $L_S$ are both disposed on the same side of the first surface 201 of the second substrate S2. As shown in FIG. 7A (on-cell type), the ultrasonic element (UE) layer $L_S$ is disposed on the first surface 201 of the second substrate S2, the polarizer POL2 is disposed on the ultrasonic element (UE) layer $L_S$, and the third substrate S3 is disposed on the polarizer POL2. As shown in FIG. 7B (touch on display, TOD), the polarizer POL2 is disposed on the first surface 201 of the second substrate S2, the ultrasonic element (UE) layer $L_S$ is disposed on the polarizer POL2, and the third substrate S3 is disposed on the ultrasonic element (UE) layer $L_S$. As shown in FIG. 7A and FIG. 7B, the piezoelectric material layers may include an UE emitting layer 221 and an UE receiving layer 223 formed on the UE emitting layer 221, to emitting and receiving the ultrasonic waves separately. However, the disclosure is not limited thereto. Emitting and receiving the ultrasonic waves can be performed by the same piezoelectric material layer, as shown in FIG. 2. Moreover, in the fabrication of the configurations as shown in FIG. 7A and FIG. 7B, the components including the UE circuits of the second assembled component 20 can be disposed on a cover substrate (i.e. the third substrate S3), followed by attaching the second substrate S2.

Furthermore, in the first embodiment, a LCD display apparatus having a RGB color filter formed on the array substrate (color filter on array, COA) is exemplified for illustration, as shown in FIG. 2. Accordingly, the first assembled component 10 further includes a color filter layer CR, the common electrodes Ec and the pixel electrodes Ep on the color filter layer CR. Those elements known in the art have not been redundantly described.

According to the descriptions of the first embodiment above, the related components of ultrasonic identification (including the piezoelectric material and array of ultrasonic identification circuit) are formed in the second assembled component 20, such as formed on an upper glass substrate (i.e. the second substrate S2), and the related components of ultrasonic identification are fabricated by using a semiconductor array process. Also, a color filter layer CR is fabricated in the underlying first assembled component 10 by using a COA technology. Thus, the related components of ultrasonic identification of the embodiment can be simply fabricated on the second substrate S2. Also, according to the configuration of the embodiment, the ultrasound penetrates through the less layered media of the second assembled component 20. Take the LCD apparatus of FIG. 2 as an example, the ultrasound penetrates through the second substrate S2, the polarizer POL2 and the third substrate S3 (e.g. two layers of glass substrates), and it does not have to penetrate through the liquid crystal layer, thereby reducing the transmission path effectively and increasing the resolution of identification. Also, the signal lines of a pixel array and the signal lines of an array of ultrasonic identification circuit of the embodiment disposed separately in different layers are overlapped each other along the direction vertical to the first substrate, which reduces the loss of aperture ratio, and improves the resolution of display consequently. Moreover, during operation of related circuits, the coupling interference between the signal lines of the pixel array and the signal lines of the array of ultrasonic identification circuit can be prevented, and the problem of excessive resistive and capacitive (RC) loading can be solved.

The disclosure is not limited to the LCD display apparatus fabricated by COA technology, and can be applicable to other types of display apparatus, such as a LCD display apparatus having a color filter layer disposed on the upper glass substrate, or an organic light-emitting diode (OLED) display apparatus, or a micro-LED display apparatus, etc. Moreover, the identical elements of the display apparatus in the first and following embodiments are designated with the same reference numerals in the drawings, and the contents are not redundantly described.

Figure 8:
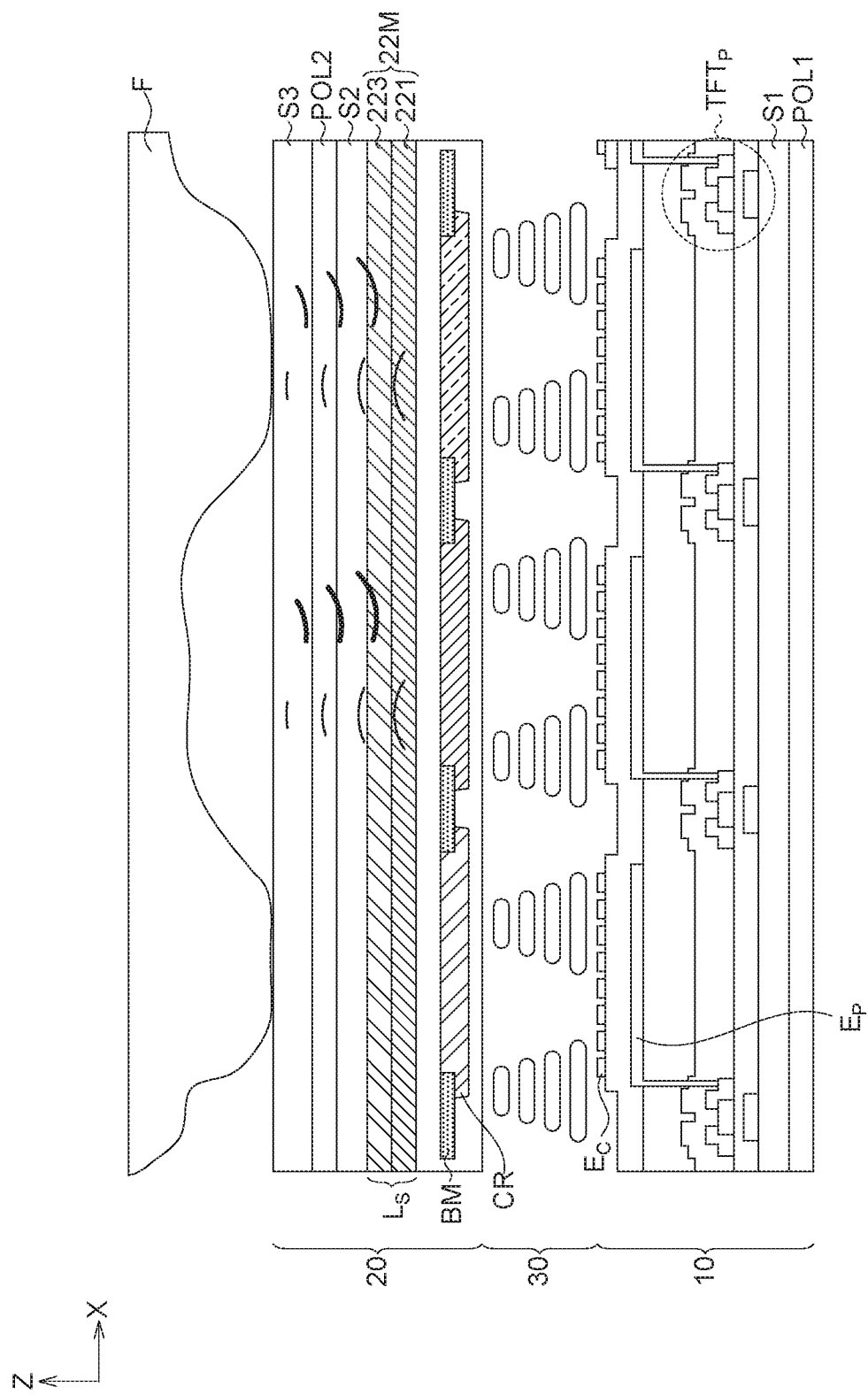
FIG. 8 is a cross-sectional view of a LCD display apparatus according to the second embodiment of the disclosure.

FIG. 8 is a cross-sectional view of a LCD display apparatus according to the second embodiment of the disclosure. The LCD display apparatus has a color filter layer CR disposed on the upper glass substrate, wherein a display medium layer 30 is a liquid crystal layer, and the color filter layer CR is disposed on the ultrasonic element (UE) layer $L_S$ and adjacent to the display medium layer 30. Practically, the high-temperature processes for forming metal related components can be performed prior to the fabrication of RGB photoresist for forming color filters. The details of other elements in FIG. 8 identical to that in FIG. 2 and the theory of ultrasonic identification have been described above, and those contents are not redundantly repeated.

Figure 9:
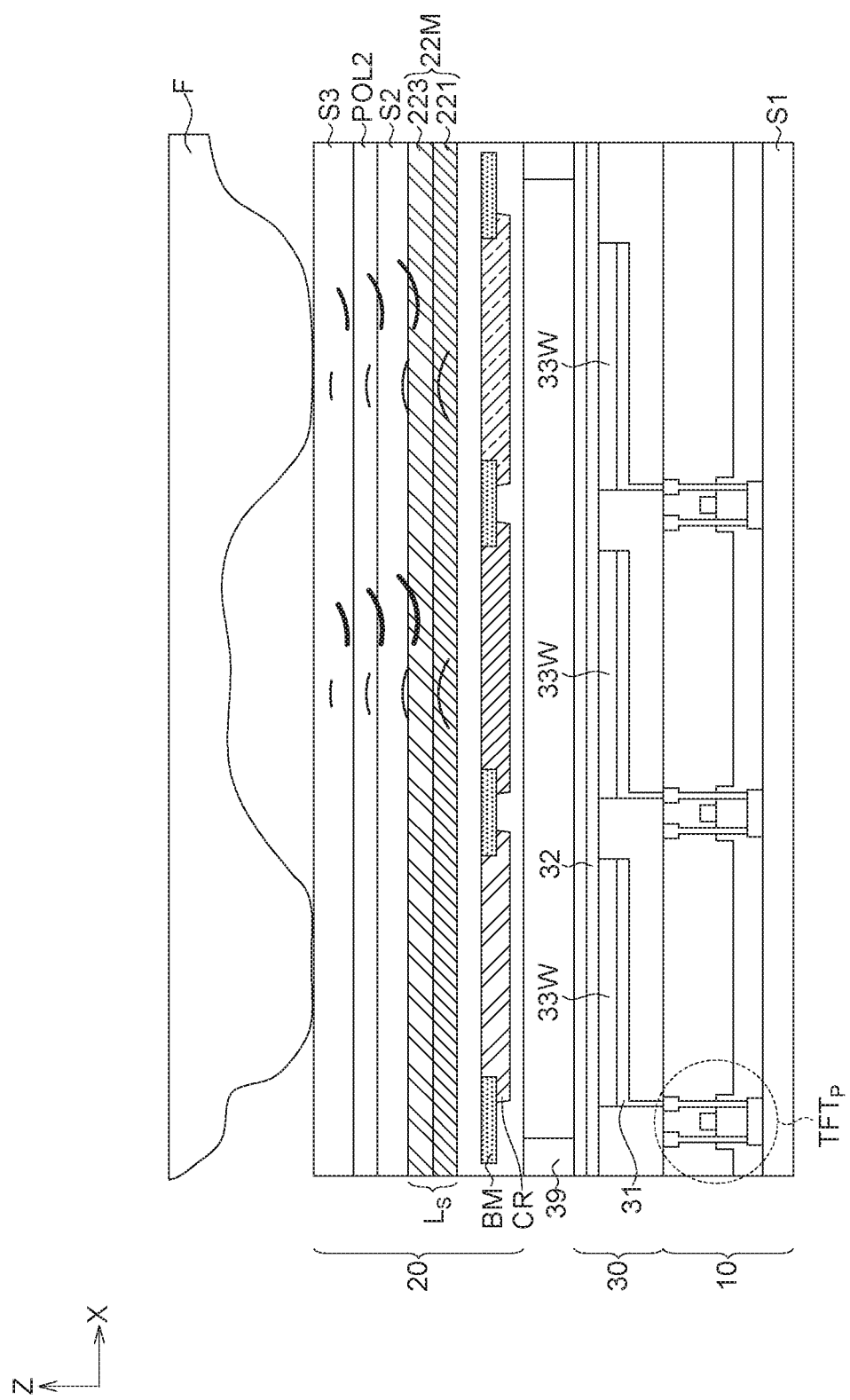
FIG. 9 is a cross-sectional view of an OLED display apparatus according to the third embodiment of the disclosure.
Figure 10:
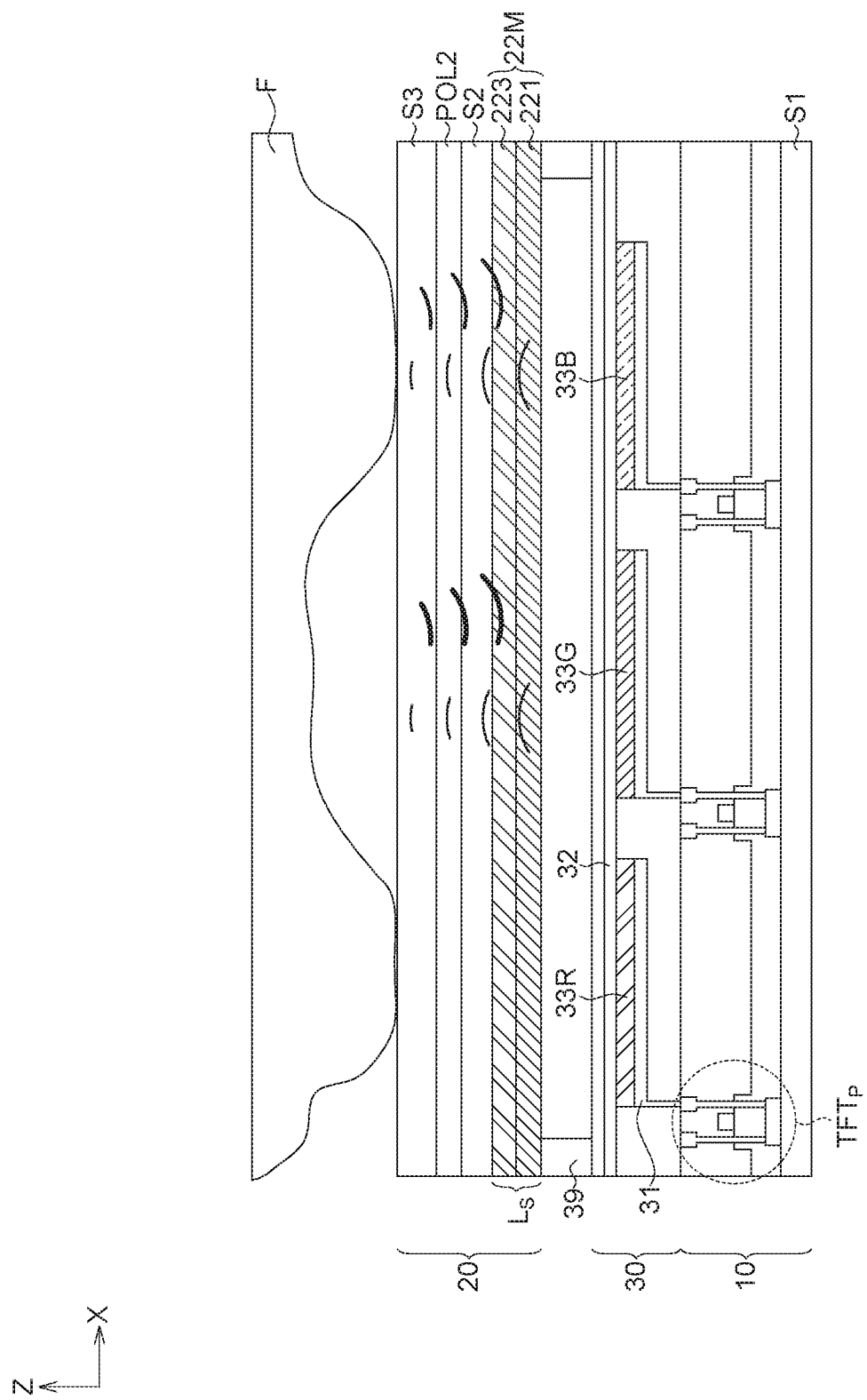
FIG. 10 is a cross-sectional view of another OLED display apparatus according to the fourth embodiment of the disclosure.

FIG. 9 is a cross-sectional view of an OLED display apparatus according to the third embodiment of the disclosure. The second assembled component 20 further includes a color filter layer CR (alternatively, the quantum dots materials can be selected and used) disposed on the ultrasonic element (UE) layer $L_S$ and adjacent to the display medium layer 30. The display medium layer 30 is an organic light emitting diode (OLED) layer 33W containing white-light emitting materials disposed between an anode 31 and a cathode 32. That is, the color filter layer CR is disposed between the ultrasonic element (UE) layer $L_S$ and the display medium layer 30. In the embodiment of FIG. 9, the signal lines of the ultrasonic element layer (such as data lines, scan lines, bias lines, and/or any traces related to the UE operation) and the TFT structures can be disposed away from the apertures of OLED pixels. In one embodiment, within at least parts of the display area corresponding to the ultrasonic element layer, the positions of the ultrasonic signal lines $DL_S$ at least partially overlaps with the positions of the pixel signal lines $DL_P$. In another embodiment, within at least parts of the display area corresponding to the ultrasonic element layer, the positions of the ultrasonic signal lines $DL_S$ are disposed away from the apertures of OLED pixels. FIG. 10 is a cross-sectional view of another OLED display apparatus according to the fourth embodiment of the disclosure. Different from the white-light OLED display apparatus of FIG. 9, FIG. 10 shows an application of a RGB-OLED display apparatus having colored photoresists. In FIG. 10, the ultrasonic element (UE) layer $L_S$ is disposed in the second assembled component 20, and the display medium layer 30 is an organic light emitting diode (OLED) layer containing RGB-light emitting materials, such as red light-emitting organic material 33R, green light-emitting organic material 33G and blue light-emitting organic material 33B, disposed between an anode 31 and a cathode 32. In the embodiment of FIG. 10, the signal lines of the ultrasonic element layer (such as data lines, scan lines, bias lines, and/or any traces related to the UE operation) and the TFT structures can be disposed away from the apertures of OLED pixels. In one embodiment, within at least parts of the display area corresponding to the ultrasonic element layer, the positions of the ultrasonic signal lines $DL_S$ at least partially overlaps with the positions of the pixel signal lines $DL_P$. In another embodiment, within at least parts of the display area corresponding to the ultrasonic element layer, the positions of the ultrasonic signal lines $DL_S$ are disposed away from the apertures of OLED pixels. The details of other elements in FIG. 9/FIG. 10 identical to that in FIG. 2 and the theory of ultrasonic identification have been described above, and those contents are not redundantly repeated.

Figure 11:
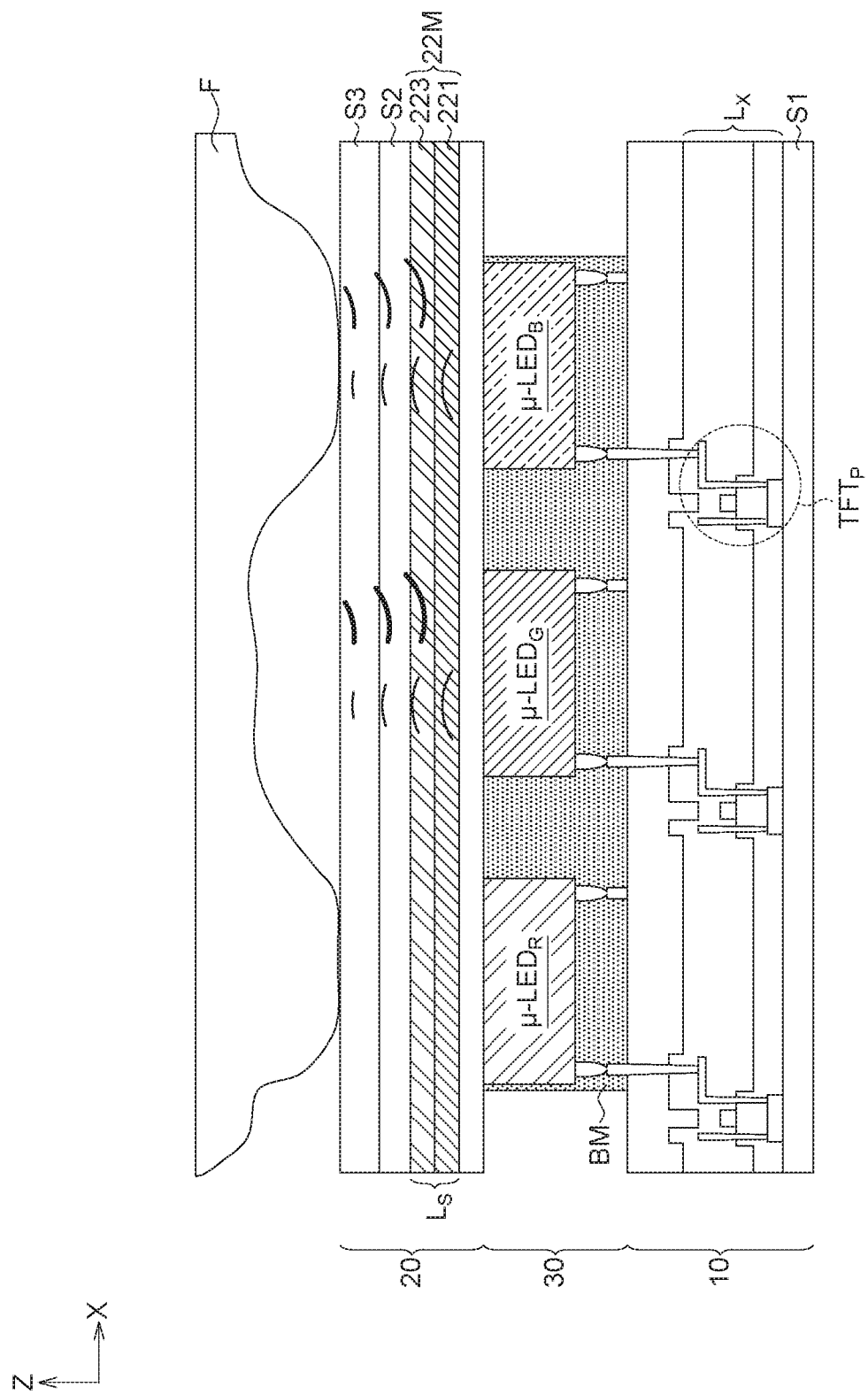
FIG. 11 is a cross-sectional view of a micro-LED display apparatus according to the fifth embodiment of the disclosure.

FIG. 11 is a cross-sectional view of a micro-LED display apparatus according to the fifth embodiment of the disclosure. In this embodiment, the ultrasonic element (UE) layer $L_S$ is disposed in the second assembled component 20, and the display medium layer 30 is a micro-LED material layer, including micro red-light emitting diodes $\mu\text{-LED}_R$, micro green-light emitting diodes $\mu\text{-LED}_G$ and micro blue-light emitting diodes $\mu\text{-LED}_B$. In the embodiment of FIG. 11, the signal lines of the ultrasonic element layer (such as data lines, scan lines, bias lines, and/or any traces related to the UE operation) and the TFT structures can be disposed away from the apertures of LED pixels. In one embodiment, at least parts of the signal lines correspond to the signal lines of the ultrasonic element layer related to the display area; for example, the positions of the ultrasonic signal lines $DL_S$ at least partially overlaps with the positions of the pixel signal lines $DL_P$. In another embodiment, at least parts of the signal lines correspond to the display area of the ultrasonic element layer, but the signal lines of the ultrasonic signal lines $DL_S$ are disposed away from the pixel apertures; for example, the positions of the ultrasonic signal lines $DL_S$ at least partially overlaps with the positions of the pixel signal lines $DL_P$, and the positions of the ultrasonic signal lines $DL_S$ are disposed away from the pixel apertures. The details of other elements in FIG. 11 identical to that in FIG. 2 and the theory of ultrasonic identification have been described above, and those contents are not redundantly repeated.

Figure 12:
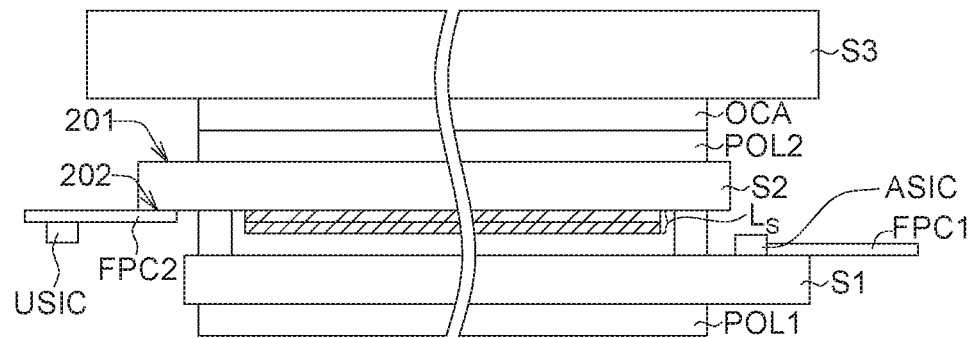
FIG. 12 and FIG. 13 schematically show two types of setting the ultrasonic identification processing units.
Figure 13:
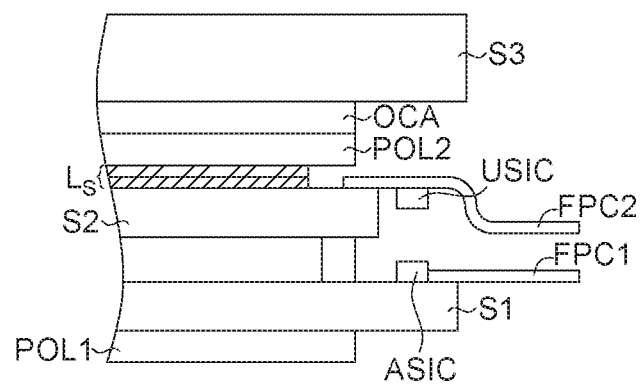

Additionally, the position of a processing unit of ultrasonic identification connected to the second substrate would be changed in accordance with the ultrasonic element (UE) layer $L_S$ fabricated on the upper surface/the lower surface (e.g. first surface 201/the second surface 202) of the second substrate S2. FIG. 12 and FIG. 13 schematically show two types of setting the ultrasonic identification processing units. As shown in FIG. 12, a display processing unit ASIC coupled to the pixel array layer (e.g. $L_X$ in FIG. 2) and an ultrasonic identification processing units USIC coupled to the ultrasonic element (UE) layer $L_S$ are disposed on different sides of the second substrate S2, wherein the display processing unit ASIC and the ultrasonic identification processing units USIC are disposed on the flexible printed circuit boards FPC1 and FPC2, respectively. Also, the ultrasonic element (UE) layer $L_S$ in FIG. 12 is formed on the second surface 202 of the second substrate S2 (in-cell), so that the flexible printed circuit board FPC2 with the ultrasonic identification processing units USIC thereon can be connected to the second surface 202 of the second substrate S2, and the lateral side of the second substrate S2 connecting the flexible printed circuit board FPC2 can be protruded from an lateral side of the first substrate S1 positioned adjacently, which facilitates disposition of the flexible printed circuit board FPC2, Applicable processing units can be one or several IC chips, and the disclosure has no particular limitation thereto.

Alternatively, the display processing unit ASIC and the ultrasonic identification processing units USIC can be disposed on the same side of the second substrate S2 for saving the space. As show in FIG. 13, the ultrasonic element (UE) layer $L_S$ is formed on the first surface 201 of the second substrate S2 (on-cell), and the ultrasonic identification processing units USIC is formed on the first substrate S1. Also, the flexible printed circuit boards FPC1 and FPC2 can be electrically connected or non-electrically connected, and the disclosure has no particular limitation thereto.

Figure 14A:
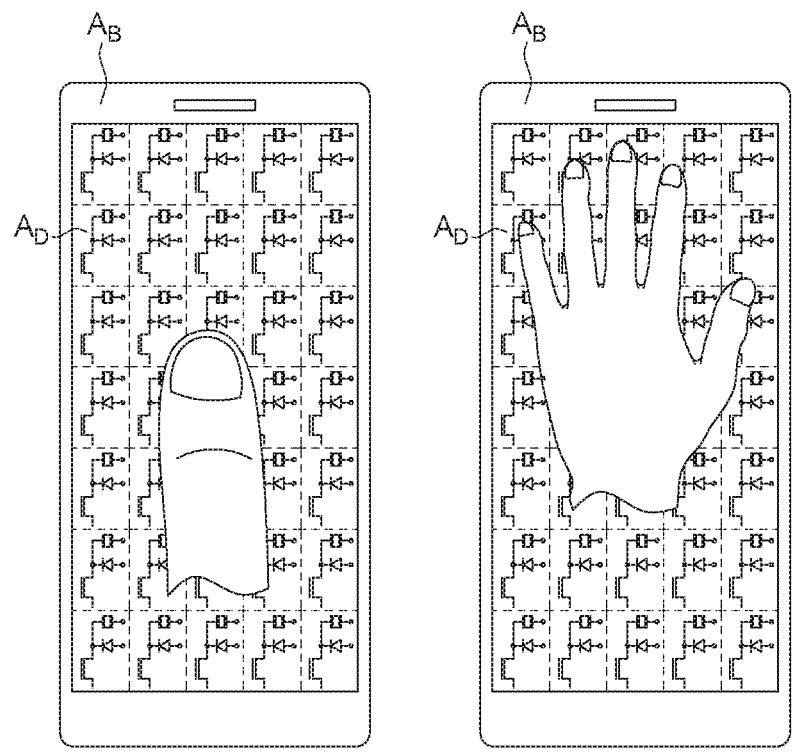
FIG. 14A and FIG. 14B schematically show two applications of the display apparatus of the embodiment for performing the ultrasonic identification.
Figure 14B:
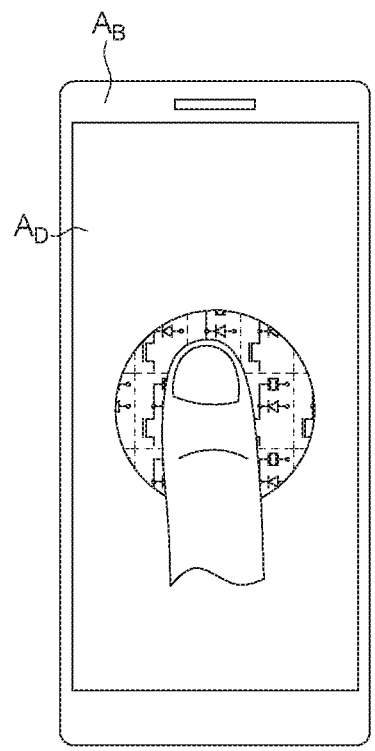

Moreover, the ultrasonic identification region can correspond to a portion or all of the region of a display area of a display apparatus, depending on the actual requirements of the practical applications. FIG. 14A and FIG. 14B schematically show two applications of the display apparatus of the embodiment for performing the ultrasonic identification. In FIG. 14A, the array of ultrasonic identification circuit is distributed correspondingly to all of the display area of the display apparatus, so that any position of the display area can be selected for proceeding the ultrasonic identification of characteristics/features of an object to be identified (/object to be detected). Accordingly, the object to be identified, such as the fingerprints of the fingers, can be placed on any position of the display panel for identifying the characteristics/features directly. Also, the larger identification area allows the detection of larger objects; for example, a full or partial palmprint can be identified by the display apparatus as shown in FIG. 14A. In FIG. 14B, the array of ultrasonic identification circuit is distributed correspondingly to a portion of the display area, so that ultrasonic identification of characteristics/features of an object to be identified (/object to be detected) is only proceeded at a specific region (e.g. the region having ultrasonic identification circuits) of the display area. It is noted that the disposition of the ultrasonic identification circuits is not particularly limited, and can be located in one or more regions of the display panel, such as one or more of the central, left, right, upper and lower regions, deepening on the actual product designs of the practical applications.

According to the aforementioned descriptions, the related elements of ultrasonic identification are disposed in the second assembled component 20, such as formed on the second substrate S2 (e.g. an upper glass substrate), by using an array process for achieving the function of features/characteristics identification. Fabrication of the related elements of ultrasonic identification of the embodiment not only is simple, but also does not affect the original process for forming display pixels. According to the embodiment, the pixel array layer $L_X$ and the ultrasonic element (UE) layer $L_S$ are disposed separately in different layers, and the signal lines of the pixel array and the signal lines of an array of ultrasonic identification circuit of the embodiment are overlapped each other along the direction vertical to the substrate, thereby reducing the loss of aperture ratio. Moreover, the design of the embodiment also decreases the coupling interference between the signal lines of the pixel array and the signal lines of the array of ultrasonic identification circuit, or solves the problem of excessive resistive and capacitive (RC) loading. Thus, the practical applications of the embodiments can flexibly match the design of signal lines of the product and meet its electrical requirements, and reduce the adverse effects or restrictions on the actual products in the application. The display apparatus and fabrication process of the embodiment are suitable for mass production. Additionally, according to the configuration of the embodiment, the ultrasonic element (UE) layer $L_S$ is disposed in the second assembled component, and the ultrasound penetrates through the thinner and less layered media of the second assembled component; that is, the ultrasound does not penetrate through the display medium layer with a certain thickness (e.g. a liquid crystal layer). Also, the path of penetration and reflection is shortened, thereby increasing the resolution of the identification of an object to be identified (/object to be detected). Moreover, the disclosure can be implemented on various type of the display apparatus; thus, the embodiments of the disclosure provide a wide range of selectable display apparatus for practical applications.

In the aforementioned embodiments, the technique features described in one embodiment are not limited to the application of that embodiment. Structural details of the aforementioned embodiments are provided for exemplification only, not for limitation. It is, of course, noted that the features of different embodiments can be combined and rearranged without departing from the spirit and scope of the present disclosure. Other embodiments with different configurations, such as change on components of the related layers and the displaying elements to meet practical requirements can be applicable. It is known by people skilled in the art that the configurations and the procedure details of the related components/layers could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display apparatus, comprising:
a first substrate;
a pixel array layer, disposed on the first substrate and defining a display area and a non-display area, and the pixel array layer including a pixel signal line;
a second substrate, disposed opposite to the first substrate;
a display medium layer, disposed between the first substrate and the second substrate; and
an ultrasonic element layer, disposed on the second substrate and including an ultrasonic signal line,
wherein, within at least parts of the display area corresponding to the ultrasonic element layer, the ultrasonic signal line formed on the second substrate is disposed above the pixel signal line formed on the first substrate, and the pixel signal line is at least partially aligned with and at least partially overlaps the ultrasonic signal line in a top view of the second substrate.

2. The display apparatus according to claim 1, wherein the second substrate has a first surface and a second surface positioned oppositely, a polarizer and the ultrasonic element layer are respectively disposed on the first surface and the second surface.

3. The display apparatus according to claim 1, further comprising a third substrate disposed on the ultrasonic element layer, wherein the second substrate has a first surface and a second surface positioned oppositely, and the first surface is more closer to the third substrate than the second surface, and both of a polarizer and the ultrasonic element layer are disposed on the first surface of the second substrate.

4. The display apparatus according to claim 3, wherein the ultrasonic element layer is disposed on the first surface of the second substrate, the polarizer is disposed on the ultrasonic element layer, and the third substrate is disposed on the polarizer.

5. The display apparatus according to claim 3, wherein the polarizer is disposed on the first surface, the ultrasonic element layer is disposed on the polarizer, and the third substrate is disposed on the ultrasonic element layer.

6. The display apparatus according to claim 1, wherein the display apparatus comprises a first assembled component, a second assembled component, and the display medium layer disposed between the first assembled component and the second assembled component, wherein the first assembled component comprises the first substrate and the pixel array layer, and the second assembled component comprises the second substrate and the ultrasonic element layer.

7. The display apparatus according to claim 6, wherein the first assembled component further comprises a color filter layer, and the display medium layer is a liquid crystal layer.

8. The display apparatus according to claim 6, wherein the second assembled component further comprises a color filter layer disposed on the ultrasonic element layer and adjacent to the display medium layer, and the display medium layer is a liquid crystal layer.

9. The display apparatus according to claim 6, wherein the second assembled component further comprises a color filter layer disposed on the ultrasonic element layer and adjacent to the display medium layer, and the display medium layer is an organic light emitting diode (OLED) layer comprising white-light emitting materials.

10. The display apparatus according to claim 6, wherein the display medium layer is an organic light emitting diode (OLED) layer comprising red, green, and blue (RGB)-light emitting materials.

11. The display apparatus according to claim 6, wherein the display medium layer is a light emitting diode layer.

12. The display apparatus according to claim 1, wherein the ultrasonic element layer further comprises a lower electrode disposed on the second substrate, an upper electrode disposed on the lower electrode, and a piezoelectric material layer disposed between the lower electrode and the upper electrode.

13. The display apparatus according to claim 12, wherein the low electrode is a patterned electrode.

14. The display apparatus according to claim 12, wherein the upper electrode is a patterned electrode.

15. The display apparatus according to claim 1, wherein a pixel region of the pixel array layer is partially overlapped or not overlapped by the ultrasonic signal line.

16. The display apparatus according to claim 15, wherein the ultrasonic element layer further comprises a read transistor, and a source and a drain of the read transistor span over the pixel region.

17. The display apparatus according to claim 1, wherein the ultrasonic element layer further comprises a pixel input electrode, and the pixel input electrode is a U-shaped patterned electrode.

18. The display apparatus according to claim 1, wherein the ultrasonic element layer further comprises a bias receiving electrode, and the pixel signal line at least partially overlaps with the bias receiving electrode in the top view of the second substrate.

* * * * *